United States Patent
McSherry et al.

(10) Patent No.: US 6,230,299 B1
(45) Date of Patent: *May 8, 2001

(54) METHOD AND APPARATUS FOR EXTRACTING AND STORING CONNECTIVITY AND GEOMETRICAL DATA FOR A DEEP SUB-MICRON INTEGRATED CIRCUIT DESIGN

(75) Inventors: Michael C. McSherry, Portland, OR (US); Richard E. Strobel, Vancouver, WA (US); Robert A. Todd, Tigard; Paul M. Nguyen, Beaverton, both of OR (US)

(73) Assignee: Mentor Graphics Corporation, Wilsonville, OR (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/052,895

(22) Filed: Mar. 31, 1998

(51) Int. Cl.[7] ............................................. G06S 17/50
(52) U.S. Cl. ....................................... 716/1; 716/10
(58) Field of Search ..................... 395/500.02, 500.06, 395/500.13; 716/10, 1

(56) References Cited

U.S. PATENT DOCUMENTS

| | | | | |
|---|---|---|---|---|
| 5,896,300 | * | 4/1999 | Raghavan | 716/10 |
| 5,999,726 | * | 12/1999 | Ho | 395/500.06 |
| 6,006,024 | * | 12/1999 | Guruswamy | 395/500.13 |

\* cited by examiner

*Primary Examiner*—Matthew Smith
*Assistant Examiner*—Thuan Do
(74) *Attorney, Agent, or Firm*—Columbia IP Law Group, LLC (57) ABSTRACT

A data extraction tool is provided to extract filtered connectivity and geometrical data for specified layout cell hierarchies of an integrated circuit (IC) design, e.g. a deep sub-micron IC design. The connectivity and geometrical data for each layout cell hierarchy are extracted at least in part in accordance with specified parasitic effect windows. In one embodiment, the data extraction tool includes a filtered extraction function that operates to extract connectivity and geometrical data for layout nets of each layout cell hierarchy of the IC design, one or more layout nets at a time. Additionally, one or more filtered databases are provided to store the filtered connectivity and geometrical data of the layout cell hierarchies.

48 Claims, 8 Drawing Sheets

LAYOUT
CELL HIERARCHIES SPECIFICATION

FIG. 2

RULE FILE

FIG. 4

DEX [ - FILE ] < RULE_FILE_NAME > < HCELL_FILE_NAME >

METHOD AND APPARATUS FOR EXTRACTING AND STORING CONNECTIVITY AND GEOMETRICAL DATA FOR A DEEP SUB-MICRON INTEGRATED CIRCUIT DESIGN

BACKGROUND OF THE INVENTION

1. Field of the Invention

The present invention relates to the field of electronic design automation (EDA). More specifically, the present invention relates to EDA tools for parasitic extraction in the process of designing sub-micron integrated circuit.

2. Background Information

The technology of large scale integration continues to advance rapidly. Integrated circuits (IC) fabricated employing deep sub-micron processes are increasingly common and increasingly complex. One of the challenges faced by today's deep sub-micron IC designers is the issue of parasitic effects of passive interconnect. Deep sub-micron IC designers have come to recognize that these effects cannot be ignored, else the design can fail. These effects play an important role in timing, power, reliability as well as noise performance. In order to take parasitic effects of passive interconnect into consideration in post layout analysis for timing, power, etc., it is necessary to create electrical models for the physical connections present between the various devices in a deep sub-micron IC design, a process known as parasitic extraction. Multiple parasitic extractions performed repeatedly at different points in time to create multiple electrical models for different views of the design are often required.

With respect to parasitic extraction for deep sub-micron IC designs, conventional EDA tools typically suffer from at least four disadvantages:

(a) They do not support enough rich models to describe the increasingly complex processes;

(b) They do not adequately address electrical interdependence between a physical net model and a design model;

(c) They are incapable of dealing with the enormous data volumes generated by the increasingly complex sub-micron designs; and (d) They do not efficiently support concurrent use by multiple post-layout analysis tools.

Thus, a more effective and yet efficient approach to extracting and storing connectivity and geometrical data for a deep sub-micron IC design that are comprehensive and organized to meet the needs of parasitic extraction is desired.

SUMMARY OF THE INVENTION

A data extraction tool is provided to extract filtered connectivity and geometrical data for specified layout cell hierarchies of an integrated circuit (IC) design, e.g. a deep sub-micron IC design. The connectivity and geometrical data for each layout cell hierarchy are extracted at least in part in accordance with specified parasitic effect windows. In one embodiment, the data extraction tool includes a filtered extraction function (FEX) that operates to extract connectivity and geometrical data for layout nets of a layout cell hierarchy of the IC design, one or more layout nets at a time. The connectivity and geometrical data for each layout net are extracted at least in part in accordance with specified parasitic effect windows of layout layers of the specified layout cell hierarchy.

Additionally, one or more filtered databases (FDB) are provided to store the filtered connectivity and geometrical data of the layout cell hierarchies. In one embodiment, one FDB is employed for each layout cell hierarchy, and the filtered connectivity and geometrical data are indexed by layout nets of the layout cell hierarchy.

BRIEF DESCRIPTION OF DRAWINGS

The present invention will be described by way of exemplary embodiments, but not limitations, illustrated in the accompanying drawings in which like references denote similar elements, and in which:

Note: FIGS. 5a–5c form FIG. 5, and so forth.

DETAILED DESCRIPTION OF THE INVENTION

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without the specific details. In other instances, well known features are omitted or simplified in order not to obscure the present invention.

Parts of the description will be presented in terms of operations performed by a computer system, using terms such as data, flags, bits, values, characters, strings, numbers and the like, consistent with the manner commonly employed by those skilled in the art to convey the substance of their work to others skilled in the art. As well understood by those skilled in the art, these quantities take the form of electrical, magnetic, or optical signals capable of being stored, transferred, combined, and otherwise manipulated through mechanical and electrical components of the computer system; and the term computer system include general purpose as well as special purpose data processing machines, systems, and the like, that are standalone, adjunct or embedded.

Various operations will be described as multiple discrete steps in turn, in a manner that is most helpful in understanding the present invention, however, the order of description should not be construed as to imply that these operations are necessarily order dependent. In particular, these operations need not be performed in the order of presentation.

Figure 1:
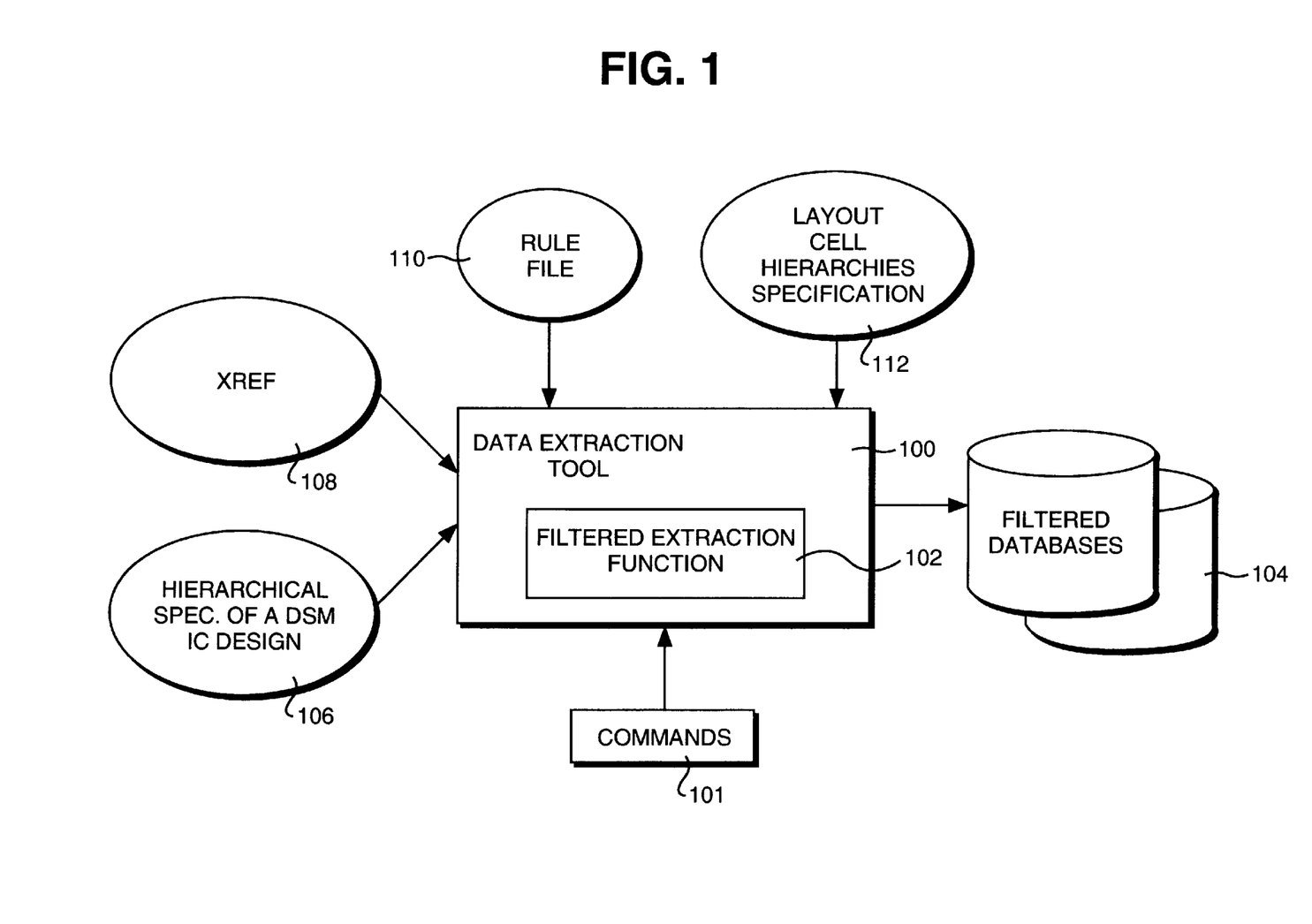
FIG. 1 illustrates one embodiment of the present invention including a data extraction tool and filtered databases.

Referring now to FIG. 1, wherein a block diagram illustrating one embodiment of the present invention is shown. As illustrated, the present invention includes data extraction tool 100 and filtered databases (FDB) 104. For the illustrated embodiment, data extraction tool 100 includes filtered extraction function (FEX) 102. Together, the elements cooperate to advantageously extract and store connectivity and geometrical data for layout cell hierarchies of deep sub-micron IC designs, to facilitate subsequent parasitic extraction, without most of the earlier described limitations of the prior art.

In accordance with the present invention, responsive to commands 101, data extraction tool 100 extracts filtered connectivity and geometrical data for specified layout cell hierarchies at least in part in accordance with specified parasitic effect windows. For the illustrated embodiment, data extraction tool 100 extracts the filtered connectivity and geometrical data for the specified layout cell hierarchies of a deep sub-micron IC design from its hierarchical specification, i.e., specification 106, using control information in rule file 110 and layout cell hierarchy specification 112, and optionally using references in cross references (XREF) 108. More specifically, for the illustrated embodiment, FEX 102 extracts the filtered connectivity and geometrical data for layout layers of the layout nets of a specified layout cell hierarchy of the deep sub-micron IC design, one or more layout nets at a time, from specification 106, using references and control information contained in files 108 112. For the illustrated embodiment, rule file 110 contains the control information for the layout layers of a layout cell hierarchy, including their parasitic effect windows, and the control information for FDB 104, whereas layout cell hierarchy specification 112 specifies the layout cell hierarchies of interest.

Additionally, in accordance with the present invention, the extracted connectivity and geometrical data of the layout cell hierarchies are stored in filtered databases (FBD) 104. For the illustrated embodiment, one FDB 104 is employed for each layout cell hierarchy, and the stored data are indexed by the layout nets of the layout cell hierarchy. In other words, FEX 102 stores the extracted connectivity and geometrical data of each layout cell hierarchy, along with the layout net indices to the extracted data in a FDB 104.

Hierarchical specification 106 and XREF 108 are intended to represent a broad category of these elements known in art. For example, they may be generated based on a VHDL description of the deep sub-micron IC design using the Calibre™ product, of Mentor Graphics Corporation, Wilsonville, Oreg., assignee of the present invention. Accordingly, hierarchical specification 106 and XREF 108 will not be further described. Beside FEX 102, data extraction tool 100 includes conventional logic for performing various standard file control operations, such as validating file directories/paths, opening and accessing files, computing signatures for the open files, and so forth, that are implementation (e.g. file system) dependent and known in the art. Accordingly, except for FEX 102, data extraction tool 100 will not be further described either. Beside filtered extraction function 102, commands 101, rule file 110, specification 112 and FDB 104 will be described in further detail in turn below.

Before doing so, it should be noted that while the present invention is being described as being advantageous for extracting connectivity as well as geometrical data for layout cell hierarchies of deep sub-micron designs, the present invention may be practiced to merely extract either connectivity or geometrical data. Furthermore, while the present invention is motivated by the needs of deep sub-micron IC designs, the present invention may nevertheless be practiced for non-deep sub-micron IC designs.

Figure 2:
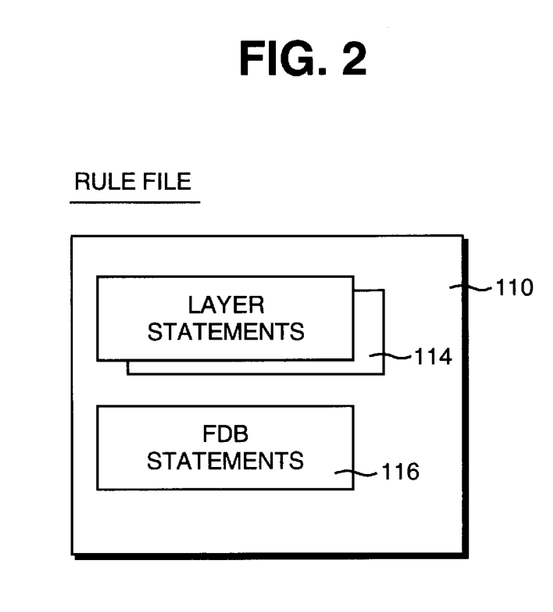
FIGS. 2–4 illustrate one embodiment each of the rule file, the layout cell hierarchies specification, and the data extraction tool command of FIG. 1 respectively.

Referring now to FIG. 2, wherein a block diagram illustrating one embodiment of rule file 110. For the illustrated embodiment, rule file 110 includes one or more layer statements 114 and at least one FDB statement 116. Each layer statement 114 specifies a layout layer of a specified layout cell hierarchy, where extraction is to be performed, and a parasitic effect window for the specified layout layer. An exemplary syntax is LAYER <layer_name> WINDOW <non_negative_number>, where <layer_name> is the name or number of an original or derived layout layer, and <non_negative_number> is the distance from geometric shapes on the named layer beyond which parasitic effects can be ignored. In one embodiment, all capacitance layers, resistance layers, connect layers, and device pin layers are automatically included with predetermined WINDOW distances. In other words, a user of data extraction tool 100 needs not specify these layers and their parasitic effect windows. User specifications will either override or augment the default settings. In one embodiment, the defaulted WINDOW distances for capacitance layers, resistance layers, connect layers, and device pin layers are determined by the maximum distance and width parameters in the capacitance statements in rule file 110. In yet another embodiment, additional control mechanism, e.g. through user environment variables, is provided to request FEX 102 to perform extraction for only user specified layers, and using only user specified parasitic effect windows.

The at least one FDB statement 116 specifies control information for FDB's 104, including control information for forming the file identifiers for the FDBs 104. In one embodiment, one FDB 104 is employed for each layout cell hierarchy. But notwithstanding that organization, one FDB statement 116 is employed. For this embodiment, FDB statement 116 merely specifies the common portion of the file identification information of the FDB's. The specified control information are concatenated with the identity of each of the layout cell hierarchies to form the unique file names for the FDBs 104. Additionally, in one embodiment, the maximum number of layout nets to have their data stored in the specified FDB may also be specified, as well as the layout nets to be excluded. An exemplary syntax is FDB <file_path> GLOBAL <num>[Exclude Layout|Source <name>], where <file_path> identifies the common pathname to be concatenated with the identities of the layout cell hierarchies to form the file identifiers for the FDB's, <num> denotes the maximum number of layout nets to have their data stored in a single FDB, and Exclude specifies the layout or source nets to be excluded. Examples of such nets are VDD and VSS, i.e. the power and ground nets. Multiple FDB files may be produced such that any one FDB will not contain more than <num>nets.

Before proceeding with the remaining descriptions of the present invention, it should be noted that while for ease of explanation, the present invention is being described with rule file 110 as having both layer statements 114 and FDB statement 116, those skilled in the art will appreciated that the present invention may be practiced with both types of these statements being specified in either a combined or separate rule files.

Figure 3:
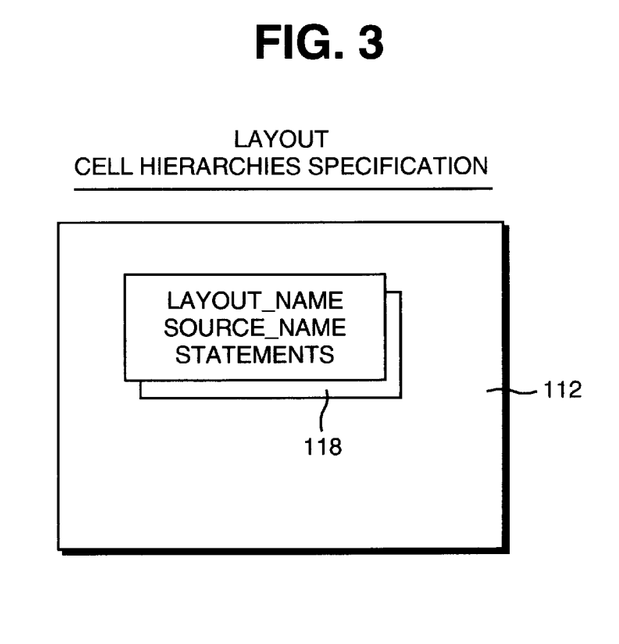

Turning now to FIG. 3, wherein a block diagram illustrating one embodiment of a layout cell hierarchies specification 112 is shown. For the illustrated embodiment, layout cell hierarchies specification 112 is a cell correspondence file used for conventional hierarchical layout verification (LVS) comparison. It includes a number of layout cell name to source cell name correspondence statements 118. Each correspondence statement 118 specifies a layout to source cell correspondence. A layout cell name may appear in multiple correspondence statements 118 denoting correspondence to different source cell names, i.e. a 1:n correspondence. Similarly, a source cell name may also appear in multiple correspondence statements 118 denoting correspondence to different layout cell names, i.e. an n:1 correspondence. In other embodiments, layout and source cell names may also be m to n corresponded. An exemplary syntax for correspondence statements 118 is <layout name><source_name>, where <layout name> is the layout cell name, and <source_name> is the corresponding source cell name.

Together, the layout cell names of correspondence statements 118 specify the layout cell hierarchies of interest. In other words, for the illustrated embodiment, for the purpose of the subject connectivity and geometrical data extraction, the source cell names are optional. They are included for the conventional hierarchical layout verification (LVS) comparison only. Furthermore, the specified layout cells are LVS correspondence points (also referred to as hcells). An instance of an hcell is referred to as an hinstance.

Figure 4:
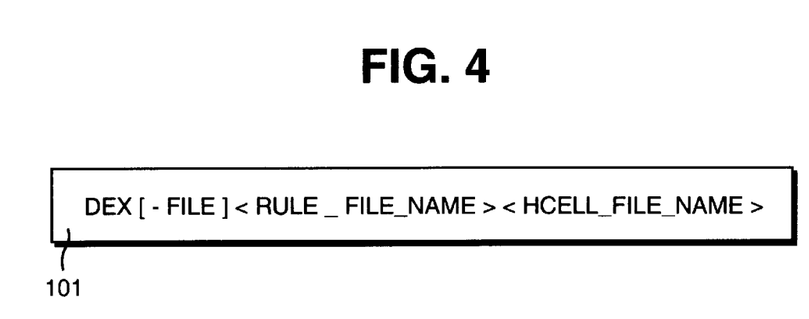

FIG. 4 illustrates one embodiment of commands 101 employed to place data extraction tool 100 into operation. For the illustrated embodiment, two commands may be issued: DEX [-full]<rule_file_name><hcell_file_name> where <rule_file_name> specifies rule file 110, and <hcell_file_name> specifies layout cell hierarchies specification 112. The absence of the optional switch "-full" causes data extraction tool 100 to extract connectivity and geometrical data for the primary layout cell only, whereas the presence of the optional switch "-full" causes data extraction tool 100 to extract connectivity and geometrical data for each hcell. More specifically, when the "-full" switch is not specified, data extraction tool 100 extracts connectivity and geometrical data for all global interconnect nets for the top layout cell only, subject to the specified parasitic effect windows for the layers and with each global interconnect net flatten to the top layout cell. When the "-full" switch is specified, data extraction tool 100 extracts connectivity and geometrical data for all global interconnect nets for each and every hcell, subject to the specified parasitic effect windows for the layers and with each global interconnect net flatten to the particular hcell having its data extracted. Note that for the purpose of this application, as conventionally understood by those skilled in the art, the terms "primary layout cell" and "top layout cell" are interchangeable.

In alternate embodiments, additional degrees of selection, i.e. more granularity between "primary" and "all hcells" are provided. Additionally (or alternatively), data extraction tool 100 is incorporated as an integral part of a multi-EDA function tool. For these embodiments, commands issued to the multi-EDA function tool are provided with a "-fdb" switch to denote the above described DEX function. Furthermore, it should be noted that while the present invention is being described with a command interface, other non-command interfaces, such as a programming interface, or a graphical end-user interface may be employed to facilitate interfacing with data extraction tool 100.

Figure 5A:
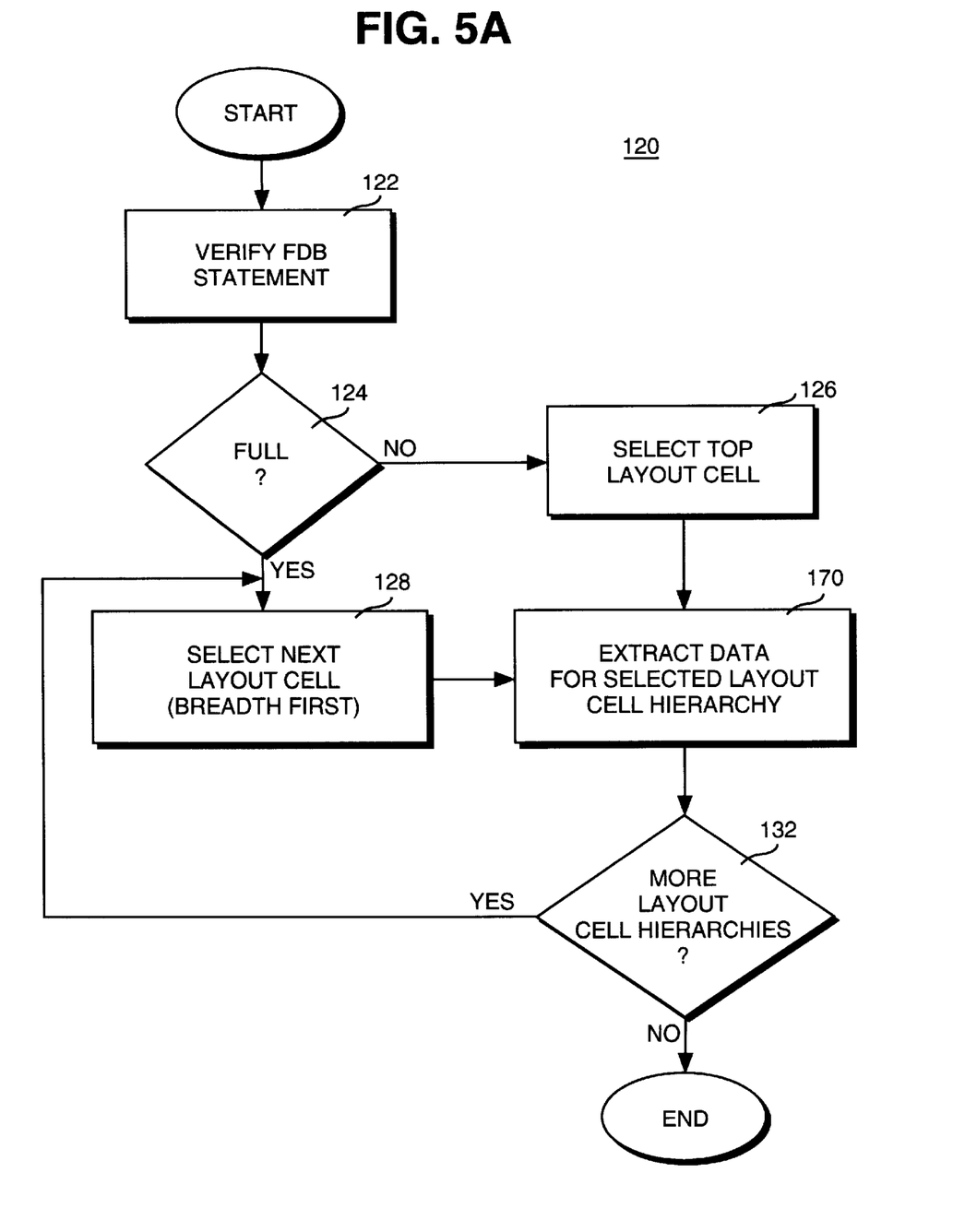
FIGS. 5a–5c illustrate one embodiment of the operational flow of the data extraction operation of the present invention.
Figure 5B:
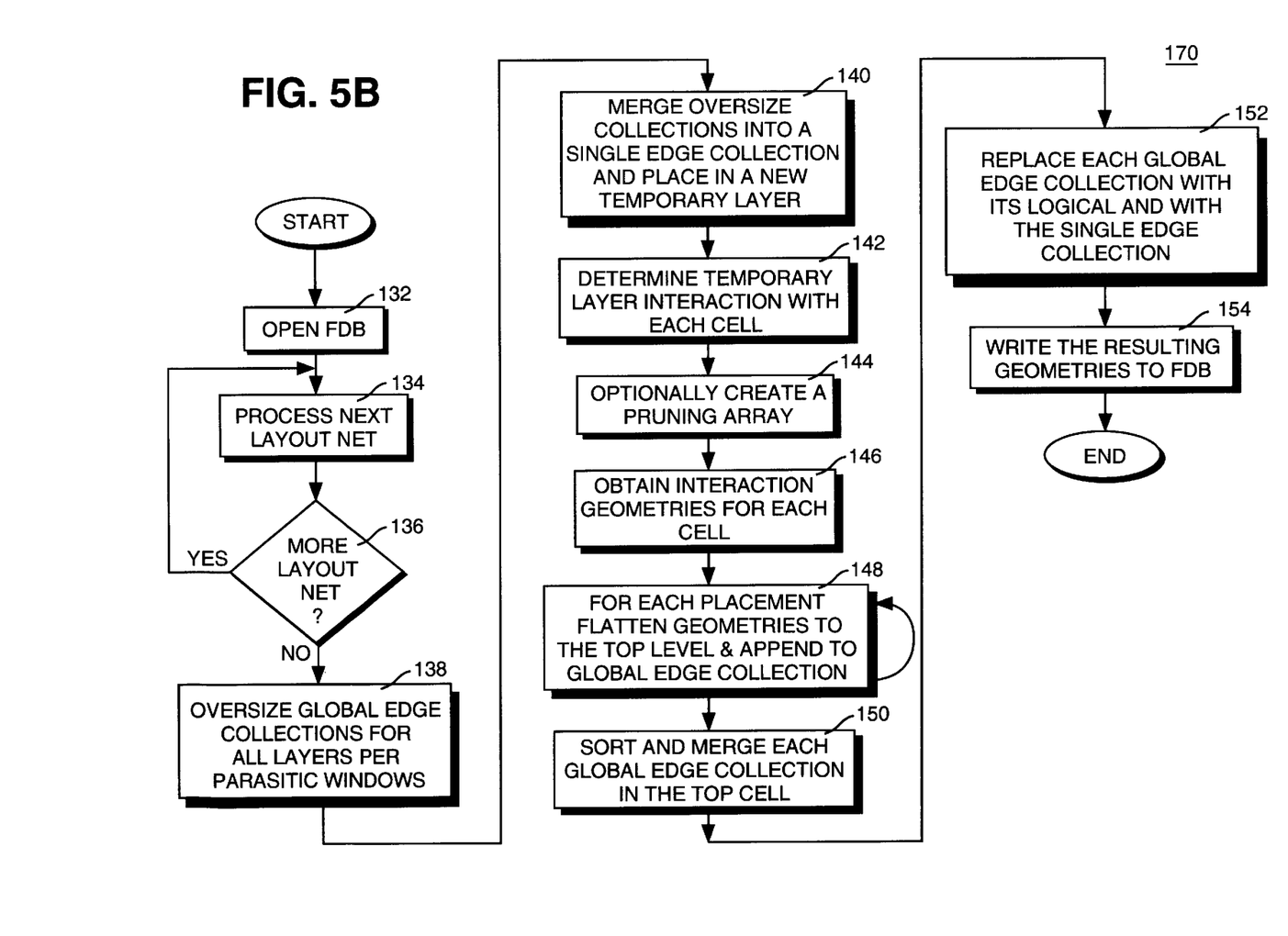
Figure 5C:
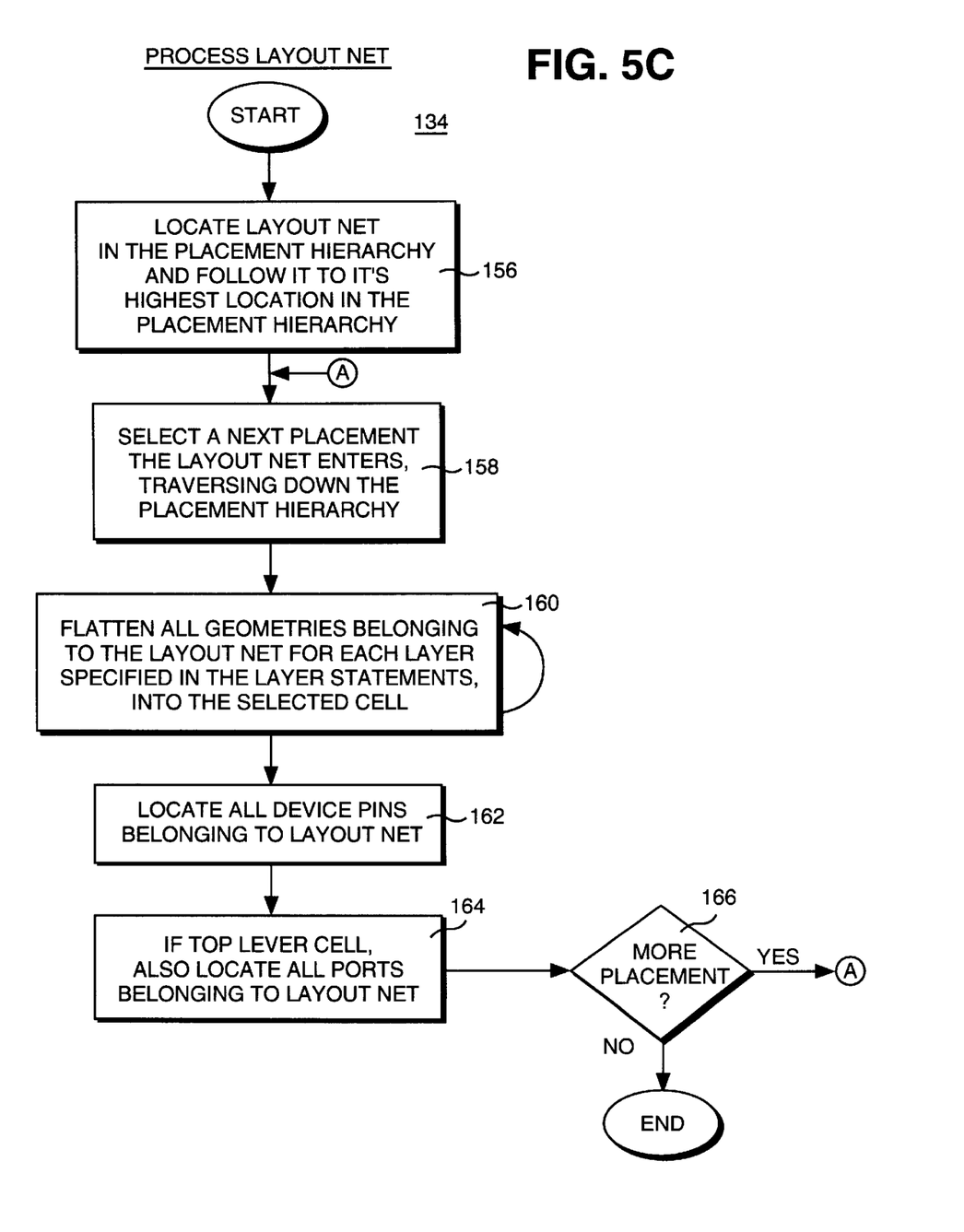

FIGS. 5a–5c illustrate one embodiment of the operational flow of the data extraction operation of the present invention. As shown in FIG. 5a, for the illustrated embodiment, data extraction tool (DEX) 100 first verifies the specified FDB statement, step 122. The specific verification actions taken are implementation dependent, i.e. the actions are file system dependent, as well as dependent on the nature of integrity checking being performed. Any one of a number of integrity checking techniques known in the art, or none may be employed. Next, DEX 100 determines if the "-full" switch is specified, i.e. whether it is to perform data extraction for the primary layout cell only or for all hcells. In the first case, DEX 100 proceeds to step 126 and selects the top layout cell, whereas in the later case, DEX 100 proceeds to step 128 and selects the next hcell, using e.g. a breadth first approach in traversing the design hierarchy. Recall that the hcell information is provided by layout cell hierarchies specification 112. In either case, DEX 100 then proceeds to step 130 and invokes FEX 102 to extract connectivity and geometrical data for all global interconnect nets for the selected cell, to be described more fully below with references to FIGS. 5b–5c. Upon completion, DEX 100 proceeds to step 132 to determine if additional data extraction operations are to be performed. In the case where the "-full" switch is not specified, the process terminates when extraction for the top layout cell is completed. In the case where the "-full" switch is specified, DEX 100 repeats steps 128–132 until data extractions have been performed for each hcell.

FIG. 5b illustrates one embodiment of step 130 of FIG. 5a. As shown, to extract connectivity and geometrical data for a selected layout cell hierarchy, FEX 102 first opens a FDB for the selected layout cell hierarchy, step 132. Then FEX 102 extracts connectivity and geometrical data for each layout net of the selected layout cell hierarchy, one or more layout nets at a time, until the desired data are extracted for all layout nets of the selected layout cell hierarchy, steps 134–136.

Skipping now to FIG. 5c, wherein one embodiment of step 134 of FIG. 5b is illustrated. As shown, to extract connectivity and geometrical data for a layout net, FEX 102 first locates the layout net in the placement hierarchy and follow it to its highest location in the placement hierarchy, step 156. Next, FEX 102 selects a next placement the layout net enters, traversing down the placement hierarchy, e.g. depth first, step 158. Then, FEX 102 flattens all geometries belonging to the layout net for each layer specified by the layer statements into the selected top layout cell or hcell, step 160. FEX 102 appends the flattened geometries to a global edge collection (EL) that accumulates all flattened geometries of the layout net on the layer over all placements. In one embodiment, FEX 102 also transforms the layout net's local net number to the layout net's global net number. Upon completion of step 160 for all layers, FEX 102 locates all device pins belonging to the layout net, step 162. Additionally, if the selected layout cell is the top layout cell, FEX 102 also locates all ports belonging to the layout net, step 164. At step 166, FEX 102 determines if more placements are to be processed. If so, FEX 102 repeats steps 158–164 until eventually it is determined in step 166 that all placements have been processed. At such time, step 134 of FIG. 5b is performed for a layout net.

Returning now to FIG. 5b, eventually FEX 102 determines at step 136 that data have been extracted for all layout nets of the selected layout cell hierarchy. FEX 102 then proceeds to step 138, wherein it oversizes the EL of each layer into a corresponding oversized edge collection OL, in accordance with the specified parasitic effect window of each layer. At step 140, FEX 102 merges all OL's into a single edge collection M (also known as net mask), and place it on a new temporary layer T as the intrinsic geometries of the selected top layout cell/hcell. At step 142, FEX 102 determines T's interaction with each layout cell. At step 144, FEX 102 optionally creates a pruning array. At step 146, for each layout cell in the selected layout cell hierarchy, FEX 102 obtains the interaction geometries of T as an edge collection IT. Except if the selected layout cell is the top layout cell, then FEX 102 obtains the intrinsic geometries of T instead. Additionally, FEX 102 also obtains the intrinsic geometries for each layer as an edge collection IL, and then compute ML=IL AND IT.

At step 148, FEX 102 follows the layout net down through the placement hierarchy again. If the pruning array was created at step 144, FEX 102 avoids entering any sub-hierarchy having no interaction with M. For each placement visited, and each layer specified in the layer statements, FEX 102 flattens the geometries of ML to the selected top layout cell or hcell, and appending them to the corresponding EL. If any layer carries node numbers, these local node numbers are also transformed into global node numbers during the flattening process. Note that at this point, the EL of each layer contains all of the flattened net shapes on the layer and all of the flattened geometries on the layer which were sufficiently close to any shape of the net on any layer plus additional geometries flattened because interactions are kept on a cell basis rather than a placement basis. At step 150, FEX 102 sorts and merges each EL created for the selected layout cell. At step 152, FEX 102 replaces each EL with EL AND M. The operation effectively cuts away the additional geometries outside the mask m. Finally, at step 154, FEX 102 writes the extracted connectivity and geometrical data to the open FDB, and upon writing, closes the FDB, to be described more fully below after an embodiment of FDB 104 is described.

Figure 6A:
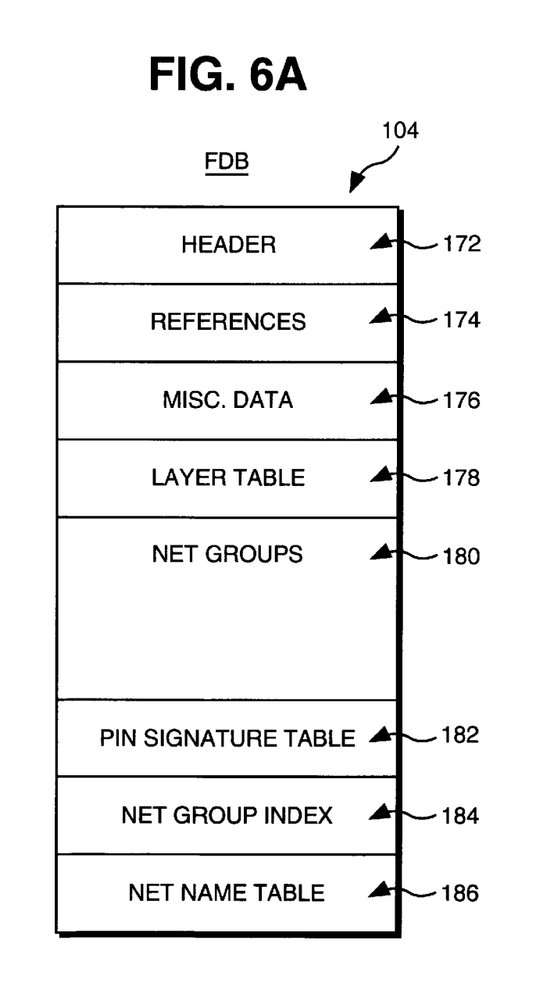
FIGS. 6a–6b illustrate one embodiment of a filtered database of the present invention.
Figure 6B:
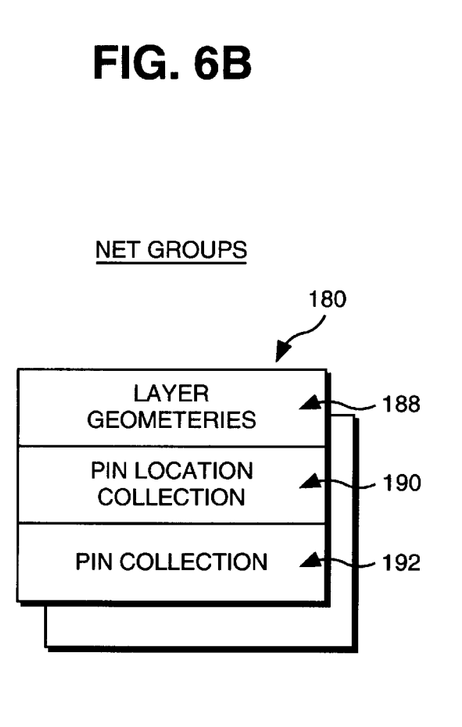

Referring now FIGS. 6a–6b, wherein two block diagrams illustrating one embodiment of a FDB 104 are shown. As illustrated in FIG. 6a, FDB 104 comprises a number of segments 172–186. In particular, FDB 104 includes segment 180 for storing extracted connectivity and geometrical data for multiple nets. As shown in FIG. 6b, for each net, segment 180 includes segment 188 for storing the extracted geometrical data for the various layers of the net, segment 192 for storing the pin collection information for the net, and segment 190 for storing the pin location information for the pins stored in segment 192.

Referring back to FIG. 6a, for the illustrated embodiment, in addition to segment 180, FDB 104 also includes segment 184 for storing indices to the nets having extracted connectivity and geometrical data stored in segment 180. FDB 104 also includes segments 178, 182 and 186 for storing a table each cross-referencing the layer names/numbers, pin signatures and net names to the nets with data stored in segment 180. Lastly, for the illustrated embodiment, FDB 104 includes segments 172–176 for storing various header information, offsets to the various segments, and various miscellaneous data, respectively. Examples of header information are file identifiers and various integrity checking values. Examples of miscellaneous data are control data about the rule file and so forth.

Figure 7A:
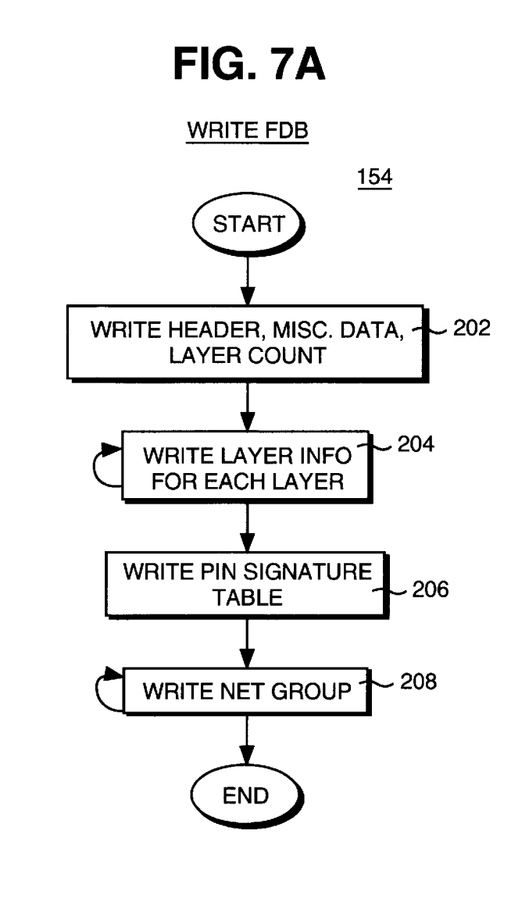
FIGS. 7a–7b illustrate one embodiment of the operational flow of the data writing operation of FIG. 5 for the filtered databases of FIG. 6.
Figure 7B:
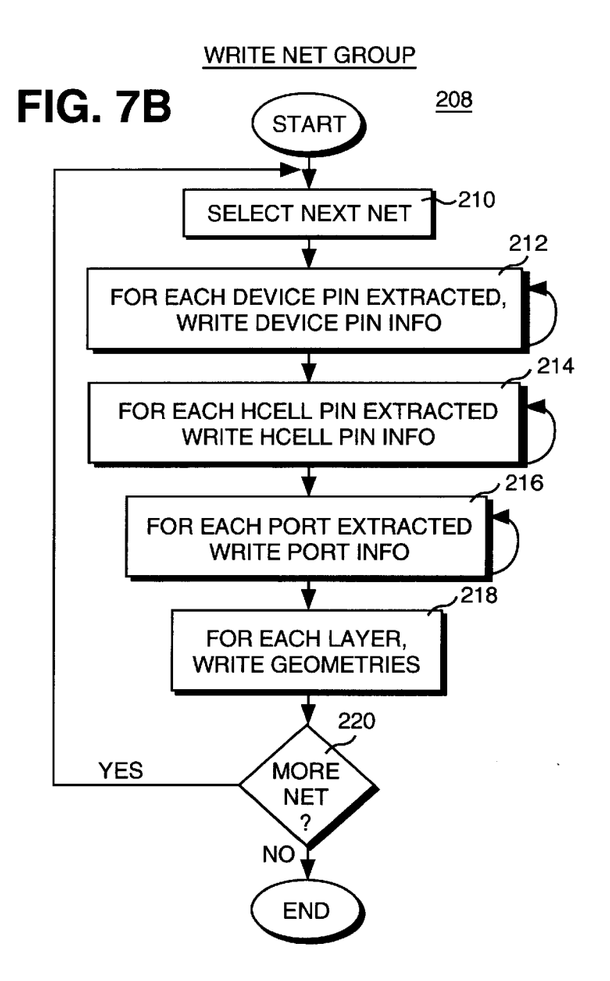

FIGS. 7a–7b illustrate one embodiment of step 154 of FIG. 5b for the embodiment of FDB 104 of FIGS. 6a–6b. As illustrated in FIG. 7a, at step 202, FEX 102 writes the header information, miscellaneous data and layer count to the appropriate segments of FDB 104. At step 204, FEX 102 writes the layer information for each layer of the selected layout cell hierarchy to the layer table segment. At step 206, FEX 102 writes the pin signature information to the pin signature table. Finally at step 208, FEX 102 writes the extracted connectivity and geometrical data for each net to the appropriate net segments of the net group segment. FIG. 7b illustrates one embodiment of step 208. As shown, at step 210, FEX 102 selects the next net. At step 212, for each device pin extracted, FEX 102 writes the device pin information into the corresponding pin collection segment. At step 214, for each hcell pin extracted, FEX 102 writes the hcell pin location information into the corresponding pin location segment. At step 216, for each port extracted, FEX 102 also writes the port information into the corresponding pin location segment. At step 218, for each layer, FEX 102 writes the geometrical data into the corresponding data segment.

Finally, at step 220, FEX 102 determines if there are more nets with data to be written. If there are still more nets with data to be written, FEX 102 repeats steps 210–220, until eventually FEX 102 determines at step 220 that all net with data to be written into FDB 104 has been written. At such time, step 154 of FIG. 5b is completed.

As those skilled in the art will appreciate, with the stored data of FDB 104 being extracted at least in part in accordance with specified parasitic effect windows of the various layers of the selected layout cell hierarchies, and organised with the described indices and cross-reference tables, the stored data of FDB 104 are particularly suitable for subsequent parasitic extraction for various post layout analysis. In one application, the stored data of FDB 104 are retrieved by a parasitic extraction tool, analysed, annotated with electrical modelling information, and then stored into a separate parasitic database (PDB). This application is the subject of co-pending U.S. patent application Ser. No. 09/052,915, filed contemporaneously, having common inventorship and assignee of the present invention. The co-pending application is hereby fully incorporated by reference.

Figure 8:
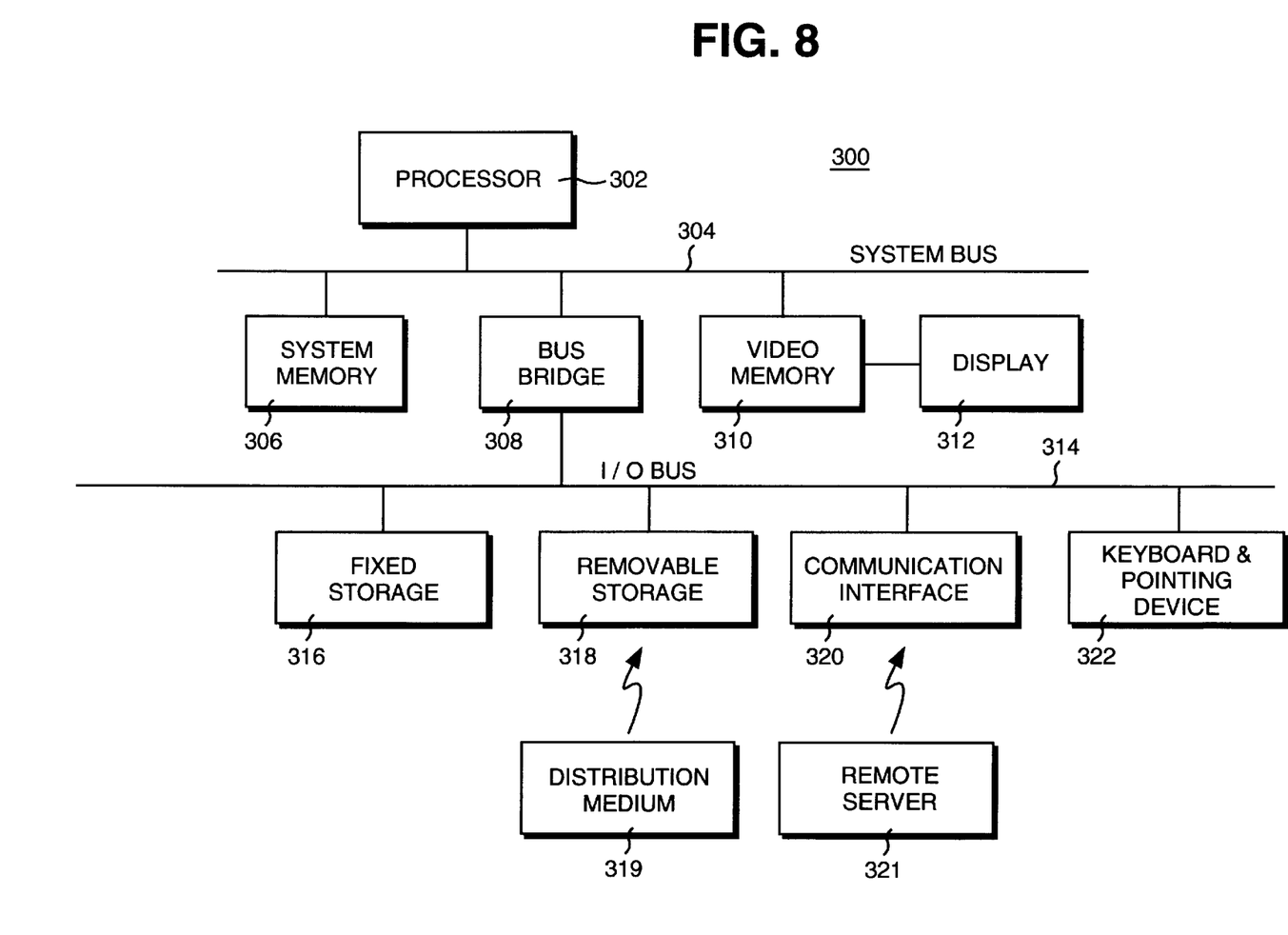
FIG. 8 illustrates an exemplary computer system suitable for programming with the data extraction tool of the present invention.

FIG. 8 illustrates one embodiment of a computer system suitable for programming with the data extraction tool of the present invention. As shown, for the illustrated embodiment, computer system 300 includes processor 302, system bus 304 and standard I/O bus 314. System bus 304 and I/O bus 210 are bridged by bus bridge 308. Coupled to system bus 304 are system memory 306 and video memory 310, against which video display 312 is coupled. Coupled to I/O bus 316 are fixed storage 316, removable storage 318, communication interface 320 and keyboard and pointing device 322. Examples of fixed storage 316 include magnetic and optical disk drives. Examples of removable storage 318 includes magnetic tape drive, diskette drive, CD-ROM drive and DVD drive. Examples of communication interface 320 include modem, ISDN adapter and network adapter.

These elements perform their conventional functions known in the art. In particular, fixed storage 316 and system memory 306 are used to store a permanent and a working copy of the programming instructions for effectuating the teachings of the present invention, when executed by processor 302. Fixed storage 316 and system memory 306 may also be used to store similar copies of other EDA tools and operating system. The permanent copy of the programming instructions that effectuate the present invention (when executed by processor 302) may be pre-installed in the factory by the manufacturer of computer system 300. Alternatively, it may be loaded from a distribution medium 319, such as a tape, a CD-ROM, or a DVD, through removable storage 318, or from a remote server 321 through communication interface 320. Furthermore, data extraction tool 100 and FDB 104 may be implemented on different ones of computer system 300 or equivalent, communicatively coupled to each other. The constitutions of these elements are known. Any one of a number of implementations of these known elements may be used to form computer system 300.

While for ease of understanding, the present invention has been described in terms of the above illustrated embodiments, those skilled in the art will recognize that the invention is not limited to the embodiments described. The present invention can be practiced with modification and alteration within the spirit and scope of the appended claims. The description is thus to be regarded as illustrative instead of restrictive on the present invention.

Thus, a method and apparatus for extracting and storing connectivity and geometrical data for a deep sub-micron IC design has been described.

What is claimed is:

1. A machine readable storage medium having stored thereon a plurality of machine executable instructions that implement:

a data extraction tool to generate filtered connectivity and geometrical data corresponding to specified layout cell hierarchies of an integrated circuit (IC) design, wherein the filtered connectivity and geometrical data are generated based at least in part on specified parasitic effect windows of respective layout layers in the IC design wherein a particular parasitic effect window defines a distance from geometric shapes on a given layout laver beyond which parasitic effects are ignored, and to store the generated connectivity and geometrical data in at least one filtered database for use in parasitic extraction.

2. The machine readable storage medium of claim 1, wherein the plurality of machine executable instructions include a subset of machine executable instructions that implement a filtered extraction function of the data extraction tool to generate the filtered connectivity and geometrical data for said specified layout cell hierarchies from a machine readable description of the IC design that includes connectivity data of each layout net, and geometrical data of each layout layer of each layout net.

3. The machine readable storage medium of claim 1, wherein the plurality of machine executable instructions include a subset of machine executable instructions that implement a filtered extraction function of the data extraction tool to generate the filtered connectivity and geometrical data for layout cell hierarchies specified in a cell correspondence file.

4. The machine readable storage medium of claim 1, wherein the plurality of machine executable instructions include a subset of machine executable instructions that implement a filtered extraction function of the data extraction tool to generate the filtered connectivity and geometrical data for said specified layout cell hierarchies in accordance with the parasitic effect windows of layout layers specified in a rule file.

5. The machine readable storage medium of claim 1, wherein the data extraction tool implemented by the plurality of machine executable instructions are further to index the stored connectivity and geometrical data by layout nets.

6. The machine readable storage medium of claim 1, wherein the data extraction tool implemented by the plurality of machine executable instructions are further to store the generated connectivity and geometrical data for each of said specified layout cell hierarchies, in a separate filtered database.

7. The machine readable storage medium of claim 6, wherein the data extraction tool implemented by the plurality of machine executable instructions are further to store the generated connectivity and geometrical data for one or more layout nets of a spedfied layout cell hierarchy, in the specified layout cell hierarchy's filtered database.

8. The machine readable storage medium of claim 7, wherein the data extraction tool implemented by the plural-ity of machine executable instructions are further to store indices for the generated connectivity and geometrical data of the one or more layout nets of the specified layout cell hierarchy, in the specified layout cell hierarchy's filtered database.

9. The machine readable storage medium of claim 7, wherein the data extraction tool implemented by the plurality of machine executable instructions are further to store one or more of a layer table, a pin signature table and a net name table for the generated connectivity and geometrical data of the one or more layout nets of the specified layout cell hierarchy, in the specified layout cell hierarchy's filtered database.

10. The machine readable storage medium of claim 7, wherein the data extraction tool implemented by the plurality of machine executable instructions are further to store device pin and polygon data as the generated connectivity and geometrical data for the one or more layout nets of the specified layout cell hierarchy.

11. A machine readable storage medium having stored thereon a filtered database of filtered connectivity and geometrical data of a layout cell hierarchy of an integrated circuit (IC) design, including connectivity and geometrical data for one or more layout nets of the layout cell hierarchy for use in parasitic extraction, said filtered connectivity and geometrical data having been generated based at least in part on specified parasitic effect windows of respective layout layers in the IC design wherein a particular parasitic effect window defines a distance from geometric shapes on a given layout laver beyond which parasitic effects are ignored.

12. The machine readable storage medium of claim 11, wherein the connectivity and geometrical data for the one or more layout nets of the layout cell hierarchy include device pin and polygon data of the one or more layout nets of the layout cell hierarchy.

13. The machine readable storage medium of claim 11, wherein the filtered database further includes indices for the connectivity and geometrical data of the one or more layout nets of the layout cell hierarchy.

14. The machine readable storage medium of claim 11, wherein the filter database further includes one or more of a layer table, a pin signature table and a net name table for the connectivity and geometrical data of the one or more layout out nets of the layout cell hierarchy.

15. A machine readable storage medium having stored thereon a plurality of machine executable instructions that implement:

a filtered extraction function to extract connectivity and geometrical data for a layout cell hierarchy of an integrated circuit (IC) design, by extracting connectivity and geometrical data for each layout net of the layout cell hierarchy, one or more layout a filtered extraction function to extract connectivity and geometrical data for a layout cell hierarchy of an integrated circuit (IC) design, by extracting connectivity and geometrical data for each layout net of the layout cell hierarchy, one or more layout nets at a time, based at least in part on specified parasitic effect windows of respective layout layers in the IC design wherein a particular parasitic effect window defines a distance from geometric shapes on a given layout laver beyond which parasitic effects are ignored, and to store the extracted connectivity and geometrical data in at least one filtered database for use in parasitic extraction.

16. The machine readable storage medium of claim 15, wherein the filtered extraction function implemented by the plurality of machine executable instructions are further to locate a layout net of the layout cell hierarchy in a placement hierarchy, follow the located layout net to the highest location in the placement hierarchy, then follow the located layout net from the highest location down through the placement hierarchy, and extract connectivity and geometrical data for the located layout net at each placement the located layout net enters.

17. The machine readable storage medium of claim 16, wherein the filtered extraction function implemented by the plurality of machine executable instructions are further to conditionally locate all ports attached to the located layout net. instructions are further to locate each device pin in the placement attached to the located layout net, and generate design coordinates for each located device pin in the placement attached to the located layout net.

18. The machine readable storage medium of claim 16, wherein the filtered extraction function implemented by the plurality of machine executable instructions are further to locate each device pin in the placement attached to the located layout net, and generate design coordinates for each located device pin in the placement attached to the located layout net.

19. The machine readable storage medium of claim 16, wherein the filtered extraction function implemented by the plurality of machine executable instructions are further to flatten all geometries of each specified layer that carry a node number and belong to the located layout net in a top layout cell of the IC design, and append the flattened geometries to a global edge collection (EL).

20. The machine readable storage medium of claim 19, wherein the filtered extraction function implemented by the plurality of machine executable instructions are further to oversize each EL into an oversized global edge collection (OL) in accordance with a specified parasitic effect window of the specified layer, merge the OL's into a single merged edge collection (M), and place M in a new temporary layer T as intrinsic geometries of the top layout cell.

21. The machine readable storage medium of claim 20, wherein the filtered extraction function implemented by the plurality of machine executable instructions are further to obtain for each layout cell of the layout cell hierarchy interaction geometries with T as an interaction edge collection IT, and obtain for each specified layer intrinsic geometries as an intrinsic edge collection IL.

22. The machine readable storage medium of claim 21, wherein the filtered extraction function implemented by the plurality of machine executable instructions are further to compute ML=IL AND IT, flatten geometries of ML into the top layout cell, append the flattened geometries to EL of the top layout cell, sort and merge each EL in the top layout cell, and replace each EL with EL AND M, the flatten geometries of EL AND M being the extracted geometries of the located layout net.

23. A computer system comprising:
    a storage medium having stored thereon a plurality of machine executable instructions that implement a data extraction tool to generate filtered connectivity and geometrical data corresponding to specified layout cell hierarchies of an integrated circuit (IC) design for use in parasitic extraction, wherein the filtered connectivity and geometrical data are generated based at least in part on specified parasitic effect windows of respective layout layers wherein a particular parasitic effect window defines a distance from geometric shapes on a given layout layer beyond which parasitic effects are ignored, and to store the generated connectivity and geometrical data in at least one filtered database; and
    an execution unit coupled to the storage medium that operates to execute the machine executable instructions.

24. The computer system of claim 23, wherein the plurality of machine executable instructions include a subset of machine executable instructions that implement a filtered extraction function of the data extraction tool to generate the filtered connectivity and geometrical data for said specified layout cell hierarchies from a machine readable description of the IC design that includes connectivity data of each layout net, and geometrical data of each layout layer of each layout net.

25. The computer system of claim 23, wherein the plurality of machine executable instructions include a subset of machine executable instructions that implement a filtered extraction function of the data extraction tool to generate the filtered connectivity and geometrical data for layout cell hierarchies specified in a cell correspondence file.

26. The computer system of claim 23, wherein the plurality of machine executable instructions include a subset of machine executable instructions that implement a filtered extraction function of the data extraction tool to generate the filtered connectivity and geometrical data for said specified layout cell hierarchies in accordance with the parasitic effect windows of layout layers specified in a rule file.

27. The computer system of claim 23, wherein the data extraction tool implemented by the plurality of machine executable instructions are further to index the stored connectivity and geometrical data by layout nets.

28. The computer system of claim 23, wherein the data extraction tool implemented by the plurality of machine executable instructions are further to store the generated connectivity and geometrical data for each of said specified layout cell hierarchies, in a separate filtered database.

29. The computer system of claim 28, wherein the data extraction tool implemented by the plurality of machine executable instructions are further to store the generated connectivity and geometrical data for one or more layout nets of a specified layout cell hierarchy, in the specified layout cell hierarchy's filtered database.

30. The computer system of claim 29, wherein the data extraction tool implemented by the plurality of machine executable instructions are further to store indices for the generated connectivity and geometrical data of the one or more layout nets of the specified layout cell hierarchy, in the specified layout cell hierarchy's filtered database.

31. The computer system of claim 29, wherein the data extraction tool implemented by the plurality of machine executable instructions are further to store one or more of a layer table, a pin signature table and a net name table for the generated connectivity and geometrical data of the one or more layout out nets of the specified layout cell hierarchy, in the specified layout cell hierarchy's filtered database.

32. The computer system of claim 29, wherein the data extraction tool implemented by the plurality of machine executable instructions are further to store device pin and polygon data as the generated connectivity and geometrical data for the one or more layout nets of the specified layout cell hierarchy.

33. A computer system comprising:
    storage medium having stored thereon a filtered database of filtered connectivity and geometrical data of a layout cell hierarchy of an integrated circuit (IC) design for use in parasitic extraction, including connectivity and geometrical data for one or more layout nets of the layout cell hierarchy, said filtered connectivity and geometrical data having been generated based at least in part on specified parasitic effect windows of respective layout layers in the IC design wherein a particular parasitic effect window defines a distance from geometric shapes on a given layout laver beyond which parasitic effects are ignored; and an execution unit coupled to the storage medium to execute machine executable instructions, accessing said filtered database.

34. The computer system of claim 33, wherein the connectivity and geometrical data for the one or more layout nets of the layout cell hierarchy include device pin and polygon data of the one or more layout nets of the layout cell hierarchy.

35. The computer system of claim 33, wherein the filtered database further includes indices for the connectivity and geometrical data of the one or more layout nets of the layout cell hierarchy.

36. The computer system of claim 33, wherein the filter database further includes one or more of a layer table, a pin signature table and a net name table for the connectivity and geometrical data of the one or more layout out nets of the layout cell hierarchy.

37. A computer system comprising:

a storage medium having stored thereon a plurality of machine executable instructions that implement a filtered extraction function to extract connectivity and geometrical data for a layout cell hierarchy of an integrated circuit (IC) design for use in parasitic extraction, by extracting connectivity and geometrical data for each layout net of the layout cell hierarchy, one or more layout nets at a time, based at least in part on specified parasitic effect windows of respective layout layers in the IC design wherein a particular parasitic effect window defines a distance from geometric shapes on a given layout layer beyond which parasitic effects are ignored, and to store the extracted connectivity and geometrical data in at least one filtered database; and an execution unit coupled to the storage medium that operates to execute the machine executable instructions.

38. The computer system of claim 37, wherein the filtered extraction function implemented by the plurality of machine executable instructions are further to locate a layout net of the layout cell hierarchy in a placement hierarchy, follow the located layout net to the highest location in the placement hierarchy, then follow the located layout net from the highest location down through the placement hierarchy, and extract connectivity and geometrical data for the located layout net at each placement the layout net enters.

39. The computer system of claim 38, wherein the filtered extraction function implemented by the plurality of machine executable instructions are further to conditionally locate all ports attached to the located layout net.

40. The computer system of claim 38, wherein the filtered extraction function implemented by the plurality of machine executable instructions are further to locate each device pin in the placement attached to the layout net, and generate design coordinates for each located device pin in the placement attached to the located layout net.

41. The computer system of claim 38, wherein the filtered extraction function implemented by the plurality of machine executable instructions are further to flatten all geometries of each specified layer that carries a node number and belongs to the located layout net in a top layout cell of the IC design, and append the flattened geometries to a global edge collection (EL).

42. The computer system of claim 41, wherein the filtered extraction function implemented by the plurality of machine executable instructions are further to oversize each EL into an oversized global edge collection (OL) in accordance with a specified parasitic effect window of the specified layer, merge the OL's into a single merged edge collection (M), and place M in a new temporary layer T as intrinsic geometries of the top layout cell.

43. The computer system of claim 42, wherein the filtered extraction function implemented by the plurality of machine executable instructions are further to obtain for each layout cell of the layout cell hierarchy interaction geometries with T as an interaction edge collection IT, and obtain for each specified layer intrinsic geometries as an intrinsic edge collection IL.

44. The computer system of claim 43, wherein the filtered extraction function implemented by the plurality of machine executable instructions are further to compute ML=IL AND IT, flatten geometries of ML into the top layout cell, append the flattened geometries to EL of the top layout cell, sort and merge each EL in the top layout cell, and replace each EL with EL AND M, the flatten geometries of EL AND M being the extracted geometries of the located layout net.

45. A machine implemented method comprising:

generating filtered connectivity and geometrical data for specified layout cell hierarchies for use in parasitic extraction based at least in part on specified parasitic effect windows of respective layout layers wherein a particular parasitic effect window defines a distance from geometric shapes on a given layout layer beyond which parasitic effects are ignored; and storing the generated connectivity and geometrical data for said specified layout cell hierarchies in one or more filtered databases.

46. The machine implemented method of claim 45, wherein the method further comprises indexing the stored connectivity and geometrical data by layout net.

47. A machine implemented method comprising:

locating a layout net of a layout cell hierarchy in a placement hierarchy;

following the located layout net to the highest location in the placement hierarchy;

following the located layout net from the highest location down through the placement hierarchy;

extracting filtered connectivity and geometric data for the located layout net at each placement the located layout net enters based at least in part on specified parasitic effect windows of respective layout layers wherein a particular parasitic effect window defines a distance from geometric shapes on a given layout layer beyond which parasitic effects are ignored; and storing the filtered connectivity and geometric data in a filtered database for use in parasitic extraction.

48. The machine implemented method of claim 47, wherein the method further comprises repeating steps locating through storing for all layout nets of the layout cell hierarchy.

* * * * *

UNITED STATES PATENT AND TRADEMARK OFFICE
CERTIFICATE OF CORRECTION

PATENT NO.    : 6,230,299 B1                                              Page 1 of 1
DATED         : May 8, 2001
INVENTOR(S)   : Michael C. McSherry et al.

It is certified that error appears in the above-identified patent and that said Letters Patent is hereby corrected as shown below:

Column 3,
Line 26, "108 112" should read -- 108-112 --.

Column 8,
Line 19, "organized" should read -- organized --.

Column 10,
Lines 48-52, "a filtered extraction function to extract connectivity and geometrical data for layout cell hierarchy of an integrated circuit (IC) design, by extracting connectivity and geometrical data for each layout net of the layout cell hierarchy, one or more layout" should be deleted as it is a duplicate of the beginning of the next paragraph of the claim.
Line 61, "laver" should read -- layer --.

Column 11,
Lines 13-16, "instructions are further to locate each device pin in the placement attached to the located layout net, and generate design coordinates for each located device pin in the placement attached to the located layout net." should be deleted as it is not part of the claim as filed or amended, and was erroneously added to the claim.

Signed and Sealed this

Twentieth Day of August, 2002

Attest:

Attesting Officer

JAMES E. ROGAN
*Director of the United States Patent and Trademark Office*